United States Patent
Guo et al.

(10) Patent No.: US 10,475,643 B2
(45) Date of Patent: *Nov. 12, 2019

(54) DEPOSITION APPARATUS AND METHOD FOR MANUFACTURING SEMICONDUCTOR DEVICE USING THE SAME

(71) Applicant: TAIWAN SEMICONDUCTOR MANUFACTURING CO., LTD., Hsinchu (TW)

(72) Inventors: Ren-Hua Guo, Taichung (TW); Ju-Ru Hsieh, Taipei (TW); Jen-Hao Yang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/876,829

(22) Filed: Jan. 22, 2018

(65) Prior Publication Data

US 2018/0144932 A1    May 24, 2018

Related U.S. Application Data

(63) Continuation of application No. 14/918,009, filed on Oct. 20, 2015, now Pat. No. 9,899,210.

(51) Int. Cl.
*H01L 21/31*     (2006.01)
*H01L 21/02*     (2006.01)
*C23C 16/455*    (2006.01)
*C23C 16/458*    (2006.01)
*C23C 16/46*     (2006.01)
(Continued)

(52) U.S. Cl.
CPC .... *H01L 21/02271* (2013.01); *C23C 16/4401* (2013.01); *C23C 16/458* (2013.01); *C23C 16/4557* (2013.01); *C23C 16/45565* (2013.01); *C23C 16/46* (2013.01); *C23C 16/50* (2013.01); *C23C 16/5096* (2013.01); *C23C 16/52* (2013.01); *H01L 21/02315* (2013.01); *H01L 21/8238* (2013.01); *H01L 29/66477* (2013.01); *H01L 29/7833* (2013.01); *H01L 21/823871* (2013.01); *H01L 29/165* (2013.01);
(Continued)

(58) Field of Classification Search
None
See application file for complete search history.

(56) References Cited

U.S. PATENT DOCUMENTS 7,371,436 B2     5/2008  Fukiage
9,899,210 B2 *   2/2018  Guo ................ C23C 16/4401
(Continued)

FOREIGN PATENT DOCUMENTS

CN          1839218 A      9/2006
CN        101423937 A      5/2009
(Continued)

*Primary Examiner* — Hung K Vu
(74) *Attorney, Agent, or Firm* — Maschoff Brennan (57) ABSTRACT

A method for manufacturing a semiconductor device includes introducing a gas into a chamber from a showerhead. The chamber has a sidewall surrounding a pedestal. The temperature of the showerhead is increased. The showerhead is thermally connected to the sidewall of the chamber, and a temperature of the sidewall of the chamber is increased by increasing the temperature of the showerhead.

20 Claims, 5 Drawing Sheets

(51) Int. Cl.

| | | |
|---|---|---|
| *C23C 16/50* | (2006.01) | |
| *C23C 16/52* | (2006.01) | |
| *H01L 29/66* | (2006.01) | |
| *C23C 16/44* | (2006.01) | |
| *C23C 16/509* | (2006.01) | |
| *H01L 21/8238* | (2006.01) | |
| *H01L 29/78* | (2006.01) | |
| *H01L 29/165* | (2006.01) | |

(52) U.S. Cl.
CPC ........ *H01L 29/665* (2013.01); *H01L 29/6659* (2013.01); *H01L 29/66636* (2013.01)

(56) References Cited

U.S. PATENT DOCUMENTS

| | | | |
|---|---|---|---|
| 2001/0035127 A1 | 11/2001 | Metzner et al. | |
| 2002/0192370 A1* | 12/2002 | Metzner | C23C 16/407 427/248.1 |
| 2003/0066482 A1 | 4/2003 | Pokharna et al. | |
| 2005/0048797 A1 | 3/2005 | Fukazawa et al. | |
| 2005/0098906 A1 | 5/2005 | Satoh et al. | |
| 2006/0151002 A1 | 7/2006 | Kumar | |
| 2008/0050932 A1 | 2/2008 | Lakshmanan et al. | |
| 2008/0113110 A1 | 5/2008 | Elers et al. | |
| 2009/0095221 A1 | 4/2009 | Tam et al. | |
| 2009/0170319 A1 | 7/2009 | Richter et al. | |
| 2013/0189841 A1 | 7/2013 | Balseanu et al. | |
| 2013/0200461 A1 | 8/2013 | Liu et al. | |
| 2014/0118751 A1 | 5/2014 | Rajagopalan et al. | |

FOREIGN PATENT DOCUMENTS

| | | |
|---|---|---|
| CN | 101506960 A | 8/2009 |
| EP | 1150330 A2 | 10/2001 |
| EP | 2 007 917 B1 | 12/2008 |
| EP | 2 628 823 A2 | 8/2013 |
| JP | H09-316644 A | 12/1997 |
| JP | 2005-79141 A | 3/2005 |
| JP | 2010-168652 A | 8/2010 |
| KR | 10-2013-0091625 A | 8/2013 |
| TW | 201335998 A | 9/2013 |

\* cited by examiner

DEPOSITION APPARATUS AND METHOD FOR MANUFACTURING SEMICONDUCTOR DEVICE USING THE SAME

PRIORITY CLAIM AND CROSS-REFERENCE

The present application is a continuation of U.S. application Ser. No. 14/918,009, filed Oct. 20, 2015, which is herein incorporated by reference in its entirety.

BACKGROUND

With circuits becoming smaller and faster, device driving current improvement becomes more important. Device current is closely related to gate length, gate capacitance, and carrier mobility. Shortening poly-gate length, increasing gate capacitance and increasing carrier mobility can improve the device current performance. Gate length reduction is an on-going effort in order to shrink circuit size. Increasing gate capacitance has also been achieved by efforts such as reducing gate dielectric thickness, increasing gate dielectric constant, and the like. In order to further improve device current, enhancing carrier mobility has also been explored.

Among efforts made to enhance carrier mobility, forming a strained silicon channel is a known practice. Strain can enhance bulk electron and hole mobility. Strain can also be applied to the channel region by forming a strain-inducing contact etch stop layer (CESL) over the FET device. When such a contact etch stop layer is deposited, due to the lattice spacing mismatch between the CESL and the underlying layer, an in-plane stress develops to match the lattice spacing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1A:
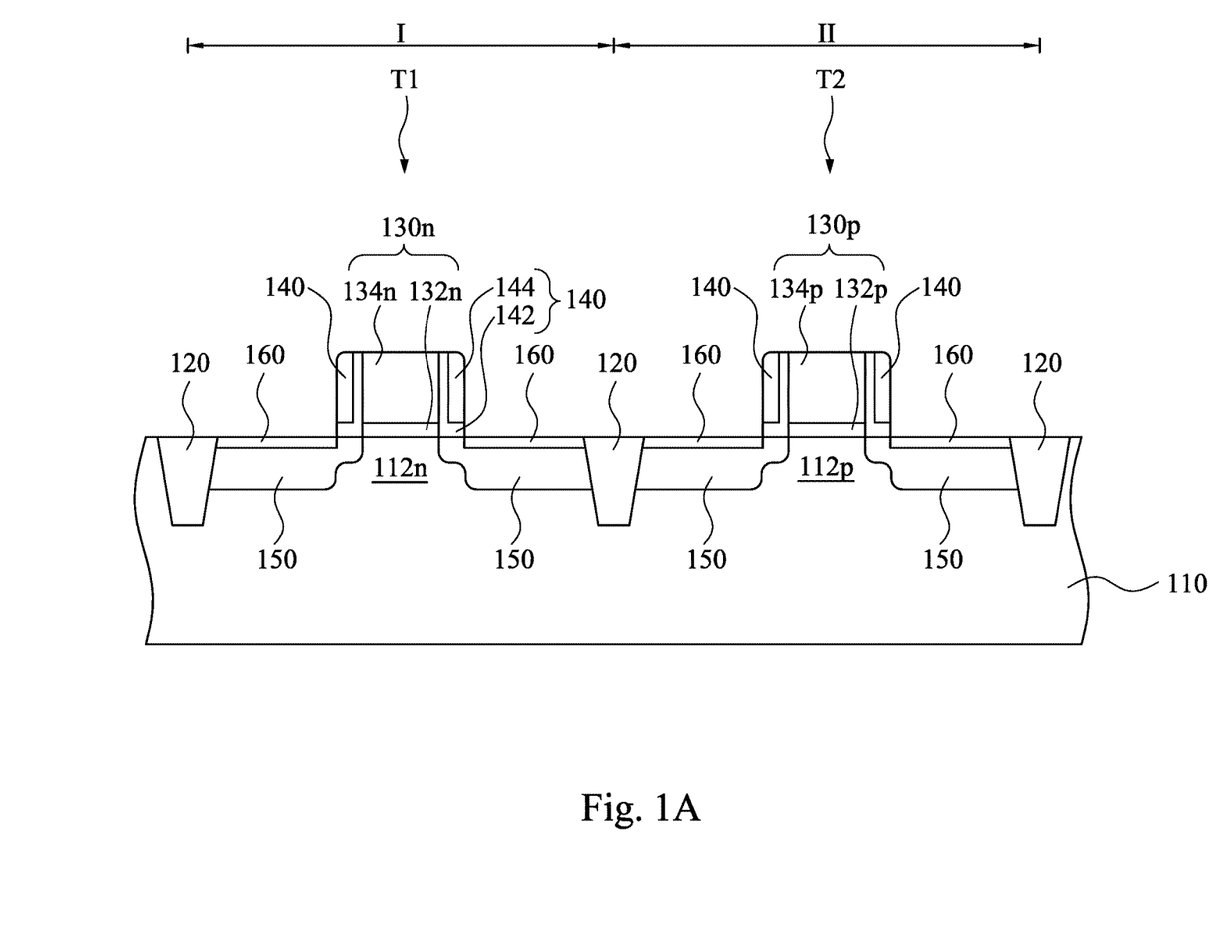
FIGS. 1A to 1D are cross-sectional views of a method for manufacturing a semiconductor device at various stages in accordance with some embodiments of the present disclosure.

FIGS. 1A to 1D are cross-sectional views of a method for manufacturing a semiconductor device at various stages in accordance with some embodiments of the present disclosure. Reference is made to FIG. 1A. A substrate 110 is provided. The substrate 110 includes two regions, region I for forming an n-type field effect transistor (NFET) device and region II for forming a p-type field effect transistor (PFET) device. In some embodiments, the substrate 110 may include silicon (Si). Alternatively, the substrate 110 may include germanium (Ge), silicon germanium, gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

The substrate 110 also includes various doped regions such as n-well and p-wells formed by a proper technique, such as ion implantation. The substrate 110 also includes various isolation features, such as shallow trench isolation (STI) 120, formed in the substrate 110 to separate various devices (i.e., to separate the regions I and II). The formation of the STI 120 may include etching a trench in the substrate 110 and filling the trench by insulator materials such as silicon oxide, silicon nitride, or silicon oxynitride. The filled trench may have a multi-layer structure such as a thermal oxide liner layer with silicon nitride filling the trench. In some embodiments, the STI 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers.

In FIG. 1A, a gate stack 130n including a gate dielectric 132n and a gate electrode 134n is formed in the region I. Similarly, a gate stack 130p including a gate dielectric 132p and a gate electrode 134p is formed in the region II. In some embodiments, in order to form the gate stacks 130n and 130p, a gate dielectric layer is formed on the substrate 110, followed by a gate electrode layer. The gate dielectric layer and the gate electrode layer are then patterned, forming the gate dielectrics 132n and 132p and the gate electrodes 134n and 134p in regions I and II, respectively. As is known in the art, hard masks (not shown) may be formed on the gate stacks 130n and 130p for process reasons, wherein the hard masks may include silicon nitride.

The gate dielectrics 132n and 132p may include various known materials such as a silicon oxide, a silicon nitride, or a silicon oxynitride. Alternatively, the gate dielectrics 132n and 132p may have high dielectric constant (HK) values. In some embodiments, the gate dielectrics 132n and 132p include $HfO_2$. Alternatively, the gate dielectrics 132n and 132p may include HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The gate dielectrics 132n and 132p can be formed by a suitable process such as atomic layer deposition (ALD). Other methods to form the gate dielectrics 132n and 132p include metal organic chemical vapor deposition (MOCVD), physical vapor deposition (PVD), UV-Ozone Oxidation, or molecular beam epitaxy (MBE). The gate electrodes 134n and 134p can be made of polysilicon or other suitable materials.

A plurality of gate spacers 140 are respectively formed on sidewalls of the gate stacks 130n and 130p. The gate spacer 140 may include a seal spacer 142 and a main spacer 144. The gate spacers 140 include one or more dielectric materials, such as silicon oxide, silicon nitride, silicon oxynitride, or combinations thereof. The seal spacers 142 are formed on sidewalls of the gate stacks 130n and 130p and the main spacers 144 are formed on the seal spacers 142. In some embodiments, the gate spacers 140 include additional layers. For example, a dielectric layer (not shown) is formed on the seal spacer 142 and then the main spacer 144 is formed on the dielectric layer. In some embodiments, the seal spacer 142 includes silicon nitride, the dielectric layer includes silicon oxide, and the main spacer 144 includes silicon nitride. The seal spacers 142, the main spacers 144, and the dielectric layer are formed by deposition, photolithography, and etch processes in a known manner.

A plurality of source and drain (S/D) regions 150 are formed by a suitable technique, such as one or more ion implantations. The two S/D regions 150 in the region I define a channel region 112n beneath the gate stack 130n, and the two S/D regions 150 in the region II define a channel region 112p beneath the gate stack 130p. In some embodiments, silicide features 160 may be further formed on the S/D regions 150 to reduce the contact resistance. The silicide features 160 may be formed by a technique referred to as self-aligned silicide (salicide) including metal deposition (such as nickel deposition) onto the substrate 110, a thermal anneal to react the metal with silicon to form silicide (NiSi), and an etch to removed un-reacted metal. In some embodiments, the S/D regions 150 may further include lightly doped (LDD) regions substantially aligned with the seal spacer 142 and a heavily doped regions substantially aligned with the main spacers 144.

After the formation of the S/D regions 150, one or more annealing processes may be performed to activate the S/D regions 150. The annealing processes include rapid thermal annealing (RTA), laser annealing processes, or other suitable annealing processes. As some examples, a high-temperature thermal annealing step that may apply temperatures in the range of 900° C.-1100° C., though some other embodiments may use temperatures within a different range. As some other examples, high-temperature annealing includes a "spike" annealing process that has a very short time duration.

In some other embodiments, the S/D regions 150 may include epitaxially grown semiconductor material for proper strain effect, leading to enhanced carrier mobility in the channels 112n and 112p. In some embodiments, silicon carbide is epitaxially grown in the S/D regions 150 of region I for the NFET, and silicon germanium is epitaxially grown in the S/D regions 150 of region II for the PFET. The method to form the strained structure includes etching to form recesses in the substrate 110 and epitaxially growth to form crystalline a semiconductor material in the recesses.

In FIG. 1A, the gate stack 130n, the gate spaces 140, and the S/D regions 150 in region I form an n-type field effect transistor (NFET) T1, and the gate stack 130p, the gate spaces 140, and the S/D regions 150 in region II form a p-type field effect transistor (PFET) T2.

Figure 1B:
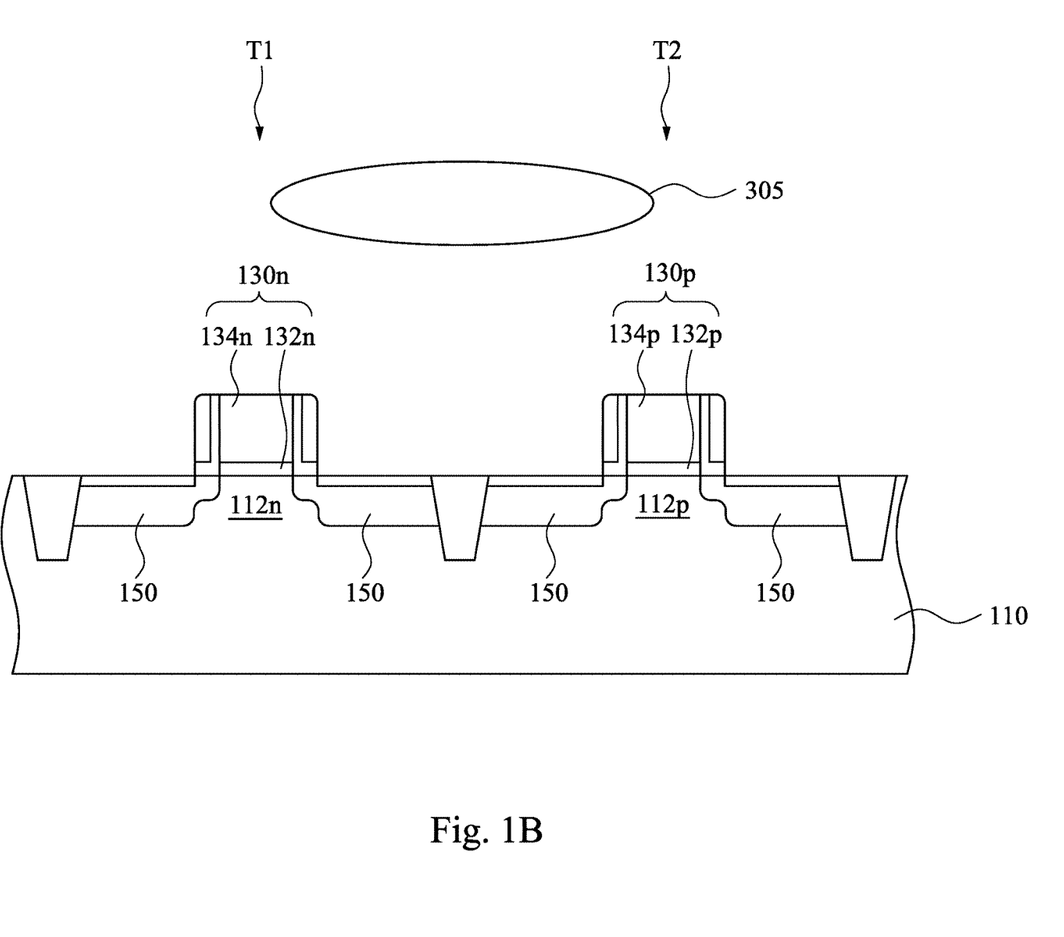

Reference is made to FIG. 1B. In some embodiments, after the NFET T1 and the PFET T2 are formed on the substrate 110, defects, such as mobile particles, on the NFET T1, the PFET T2, and the substrate 110 would act as nucleation sites for reactive precursor species and lead to formation of defects much larger than the defects during the following CVD deposition (see FIGS. 1C and 1D). The later formed defects may become killer defects for devices formed on the substrate 110. In some embodiments, the structure of FIG. 1A can be disposed in a CVD apparatus 200 to perform a plasma treatment prior to the CVD deposition. Reference is made to FIG. 2, which is a schematic diagram of the chemical vapor deposition (CVD) apparatus 200 in accordance with some embodiments. The CVD apparatus 200 includes a CVD chamber 210, a pedestal 220, a showerhead 230, and a temperature controlling system 240. The CVD chamber 210 has at least one sidewall 212. The sidewall 212 defines an accommodating space 214 in the CVD chamber 210 to accommodate the substrate 110 of FIG. 1B, which the NFET T1 and the PFET T2 are already formed thereon. The pedestal 220 is disposed in the CVD chamber 210 to support the substrate 110. The showerhead 230 is disposed in the CVD chamber 210 and above the pedestal 220 to provide reactive gases into the CVD chamber 210. The temperature controlling system 240 is connected to the showerhead 230 to control a temperature of the showerhead 230 in a range of about 70° C. to about 100° C.

In some embodiments, the CVD apparatus 200 further includes a plasma generator 260. The plasma generator 260 includes an RF source 262 and a biasing element 264. The RF source 262 is connected to the showerhead 230, and the biasing element 264 is connected to the pedestal 220. An RF signal provided by the RF source 262 can be applied to the showerhead 230, which thus acts as an electrode. The biasing element 264 is associated with the RF source 262 such that the RF power is split between the showerhead 230 and the pedestal 220. A desired voltage and power is applied by the RF source 262 to cause the reactive gases between the showerhead 230 and the pedestal 220 to discharge and form the plasma 305 (see FIG. 1B).

In some embodiments, the plasma treatment may be carried out using a nitrous oxide ($N_2O$) plasma. Other gases, such as for example argon, nitrogen, oxygen, and helium, may also be used in the plasma treatment process. Process results have shown that a plasma treatment to the substrate 110 being processed reduces the number of defects in the film deposited thereafter. The reduction of number of defects may because the plasma treatment reduces nucleation sites for generating defects on the substrate 110.

In some embodiments, the plasma is $N_2O$. $N_2O$ may be delivered at a pressure of about 2.5 torr to about 3.5 torr, at a power of about 400 watts to about 600 watts, and at a flow rate of about 7000 sccm to about 15000 sccm. The $N_2O$ can reduce the defect number of the following formed CESL 170 (see FIG. 1D) to about 0.1~about 0.5 from about 3~about 4 (which was a result when using other types of plasma).

In some embodiments, the plasma treatment may be followed by a pumping operation to get rid of the plasma used in the plasma treatment prior to the CVD deposition operation. In some other embodiments, the plasma 305 for the plasma treatment may be followed by the plasma for the deposition operation directly.

Figure 1C:
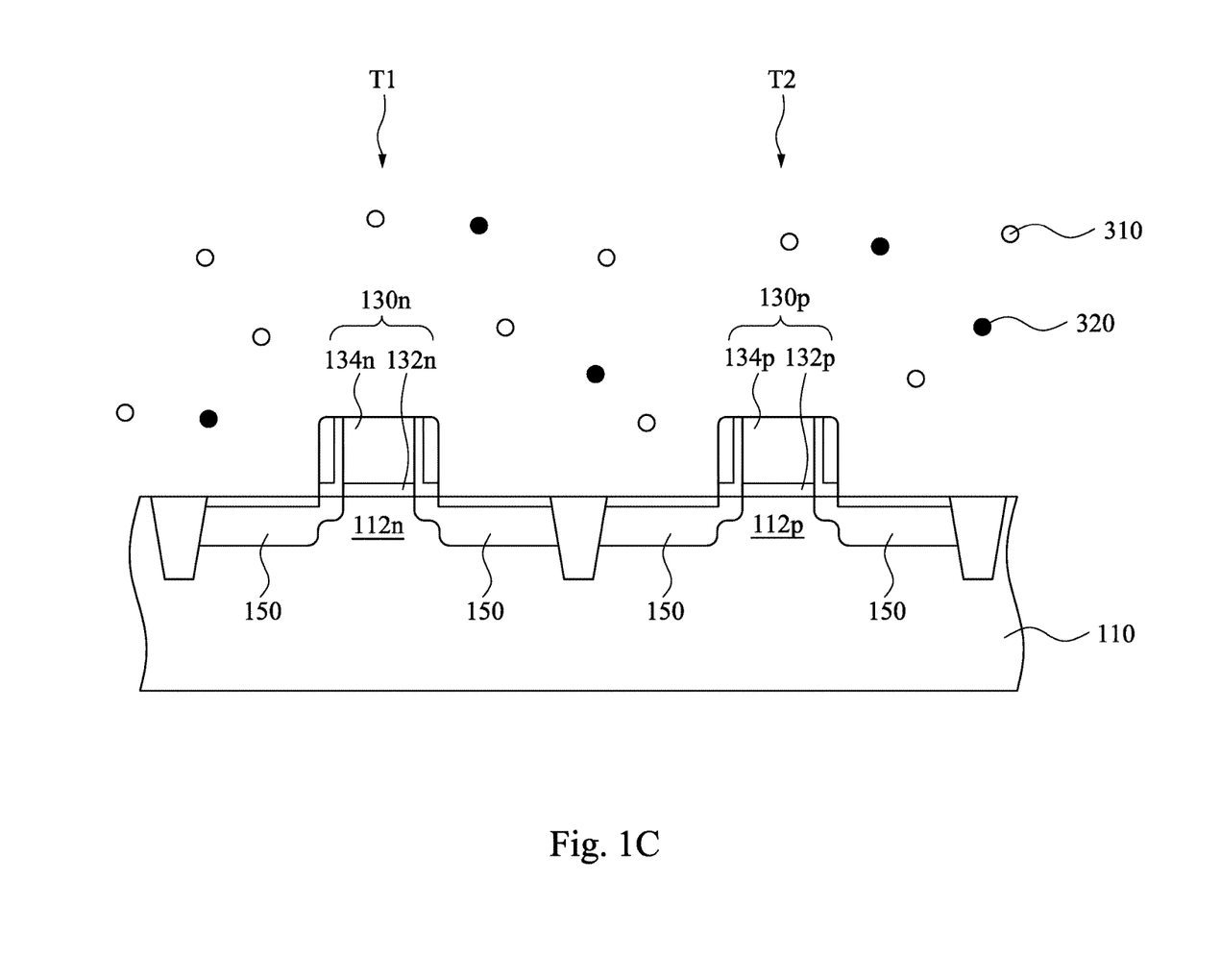
Figure 1D:
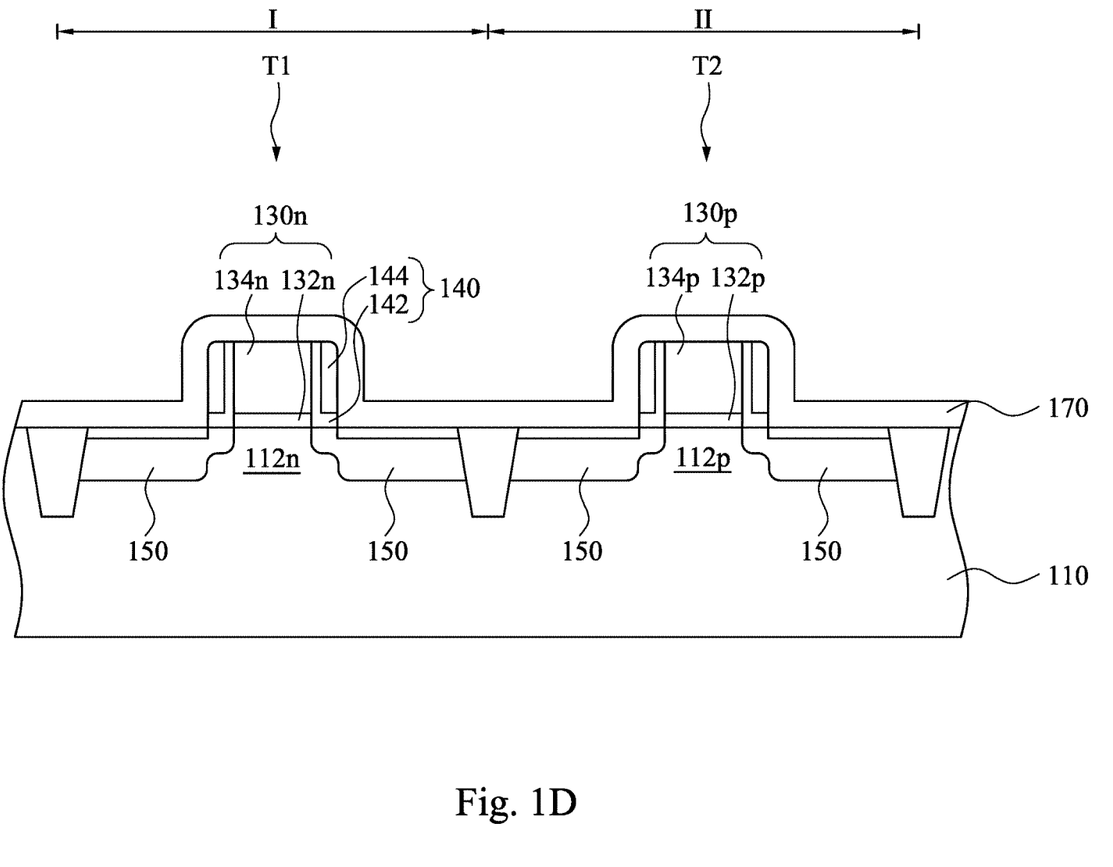
Figure 2:
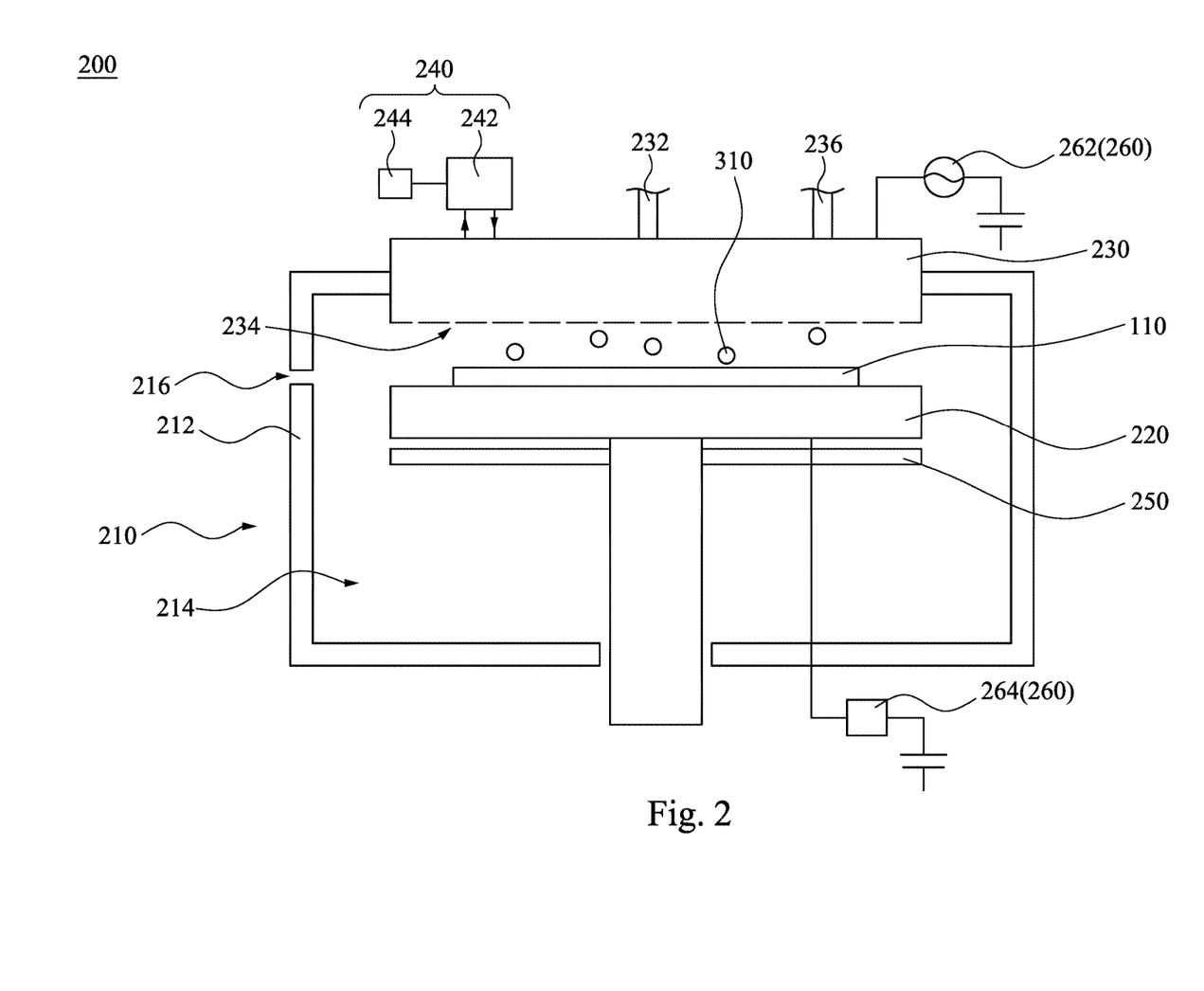
FIG. 2 is a schematic diagram of a chemical vapor deposition (CVD) apparatus in accordance with some embodiments.

Reference is made to FIGS. 1C and 1D. A contact etch stop layer (CESL) 170 is formed on the NFET T1, the PFET T2, and the substrate 110 by using a chemical vapor deposition (CVD) process. In some embodiments, the CESL 170 is a tensile-contact CESL, and the claimed scope is not limited in this respect. The tensile-contact CESL provides tensile stress in the channel regions 112n and 112p under the gate stacks 130n and 130p. The CESL 170 can be formed using the CVD apparatus 200. The showerhead 230 is further for providing precursor gases 310 into the CVD chamber 210, such that the precursor gases 310 can be deposited on the substrate 110 and form a contact etch stop layer (CESL) 170 on the substrate 110. In some embodiments, the showerhead 230 can be located very close to the pedestal 220. For example, the showerhead 230 can be located a 12 millimeter from the pedestal 220.

In FIGS. 1C, 1D, and 2, the precursor gases 310 are provided from the showerhead 230 to form the contact etch stop layer (CESL) 170 to cover the NFET T1, the PFET T2, and the substrate 110. The temperature of the showerhead 230 is controlled (or increased), such that a temperature of the precursor gases 310 is controlled (or increased) accordingly. Since the showerhead 230 is heated, the precursor gases 310 passing therethrough are heated accordingly. The heated precursor gases 310 are deposited on the substrate 110, thereby covering the NFET T1, the PFET T2, and the substrate 110 to form the CESL 170. Since the showerhead 230 has high temperature, i.e., in a range of about 70° C. to about 100° C., the heated precursor gases 310 has high temperature, too. The CESL 170 made of the high-temperature precursor gases 310 can improve the adhesion to the NFET T1, the PFET T2, and the substrate 110. Therefore, the CESL 170 is not easy be peeled from the substrate 110, and the device performance of the semiconductor device can be improved. In some embodiments, the CESL 170 may be made of silicon nitride, although other materials, such as nitride, oxynitride, boron nitride, combinations thereof, or the like, may alternatively be used.

The CVD apparatus 200 is capable of operation in either of two modes, a thermal mode and a plasma-enhanced mode. In the thermal mode, the precursor gases 310 are reacted with the heated surface of the substrate 110. For example, an electrical power source supplies power to a heating element 250 connected to the pedestal 220 to heat the pedestal 220, and thus, the substrate 110 to a temperature sufficient to thermally activate the CVD reaction. In the plasma-enhanced mode, the precursor gases 310 are subjected to electromagnetic energy in order to transform the precursor gases 310 into a reactive plasma. Other CVD processes include APCVD (atmospheric pressure chemical vapor deposition), and LPCVD (low pressure chemical vapor deposition). While APCVD systems have high equipment throughput, good uniformity and the capability to process large-diameter wafers, APCVD systems consume large quantities of process gas and often exhibit poor step coverage. LPCVD is commonly used to deposit nitride, TEOS oxide, and polysilicon films on wafer surfaces for front-end-of-line (FEOL) processes.

In FIG. 2, the showerhead 230 is configured to spray the precursor gases 310 supplied from a supply apparatus (not shown) into the CVD chamber 210 on which substrate 110 is mounted. The elements of the precursor gases 310 deposit on the surface of the substrate 110, forming the CESL 170 and some undesirable byproducts are pumped away in a gaseous form. For example, the unreacted precursor gases and the undesirable byproducts flow radially outwardly to a pumping channel 216. Accordingly, the precursor gases 310 and its reaction byproducts flow from the center of the showerhead 230 across the surface of the substrate 110 and toward the periphery of the pedestal 220, and to the pumping channel 216 to be pumped out.

The showerhead 230 includes at least one inlet path 232 and has a plurality of holes 234 connected to the inlet path 232, such that the precursor gases 310 provided by a source container (not shown) can flow along the inlet path 232 and emerge from the holes 234. In some embodiments, the showerhead 230 can spray single type of the precursor gases 310, and the inlet path 232 can connected to all of the holes 234. Therefore, the precursor gases 310 emerge from all of the holes 234. In some other embodiments, the showerhead 230 can spray multiple types of precursor gases 310, and two or more inlet paths (not shown) can be formed in the showerhead 230. The inlet paths are isolated from each other. One of the inlet paths is connected to some of the holes 234, and another inlet path is connected to the remaining holes 234. One type of the precursor gases 310 can flow along one inlet path and emerge from some of the holes 234, and another type of the precursor gases 310 can flow along another inlet path and emerge from the remaining of the holes 234. Therefore, the two precursor gases 310 are not mixed together and do not react until they enter the CVD chamber 210.

In FIG. 2, the temperature of the showerhead 230 is controlled by the temperature controlling system 240. In some embodiments, the showerhead 230 is made of stainless steel or other suitable materials such as steel, aluminum, magnesium, glass, ceramic, and desired combinations of such materials. In some embodiments, the temperature controlling system 240 is a heat exchanger, which may include a fluid cycle 242 and a controller 244. The controller 244 is configured to sense the temperature of the showerhead 230 and regulate or control the flow rate of the fluid into the showerhead 230 so as to control the temperature thereof. The fluid can be water or other suitable fluid. The fluid is prevented from entering the CVD chamber 210 because a very small amount of fluid, e.g., a few parts per billion, can ruin the CVD process. The entry of the fluid into the CVD chamber 210 can result in the rejection of the semiconductor devices, as well as costly downtime caused by the processes such as repairing and thoroughly cleaning the CVD chamber 210.

During the CVD process, the temperature of the showerhead 230 can be kept substantially lower than the temperature of the pedestal 220, so as to inhibit damage to the showerhead 230 and to promote the deposition of the reactant chemicals of the precursor gases 310 on the pedestal 220, instead of the showerhead 230 surface itself. Thus, the temperature controlling system 240 can be used to keep the inside surface of the showerhead 230 at a substantially lower temperature than the pedestal 220. Keeping the showerhead 230 at a substantially lower temperature than the pedestal 220 mitigates air leakage into the CVD chamber and tends to enhance the uniformity of the precursor gas injection across the showerhead 230. The fluid may be delivered via a fab facilities connection, and be exhausted along the fluid cycle 242 at ambient pressure and/or ambient temperature after a last cooling. The temperature of the showerhead 230 can be changed by adjusting the flow rate of the fluid. Thus, the temperature of the showerhead 230 can maintain in the range of about 70° C. to about 100° C. to improve the adhesion of the CESL 170.

In some embodiments, the showerhead 230 and the sidewall 212 are thermally connected. That is, the temperature of the sidewall 212 can be controlled through controlling the temperature of the showerhead 230. In some embodiments, the temperature of the sidewall 212 can be controlled (or increased) to a range of about 70° C. to about 100° C. to improve the adhesion of the CESL 170. In some embodiments, the sidewall 212 may be made of stainless steel or other suitable materials.

In some embodiments, a plurality of carrier gases 320 are supplied into the CVD chamber 210. In some embodiments, the carrier gases 320 can be sprayed into the CVD chamber 210 through the showerhead 230. These carrier gases 320 may be selected depending on what precursor gases 310 are used. The chemical processing using the carrier gases 320 may be performed for 1 second to 10 minutes and may be performed as a single process or multiple times of twice to ten times. At a given time after the carrier gases 320 are first sprayed into the CVD chamber 210, the precursor gases 310 are sprayed to form the CESL 170.

Some gas distribution injectors provide a shroud or carrier gases 320 that help provide a laminar gas flow during the CVD process, adjusting and maintaining uniform flow conditions in the CVD chamber 210, where the carrier gases 320 does not participate in CVD process. In some embodiments, the carrier gases 320 can be injected into the CVD chamber 210 from an inlet 236 disposed in the showerhead 230. In some other embodiments, the carrier gases 320 can be injected into the CVD chamber 210 from other inlet, and the claimed scope is not limited in this respect. In some embodiments, the carrier gases 320 may be inert gases, such as He, Ne, Ar, Kr, Xe, or Rn, and the claimed scope is not limited in this respect.

In FIG. 2, the pedestal 220 is configured to support the substrate 110. During the CVD process, the pedestal 220 further raises the substrate 110 into close proximity to the showerhead 230, such that the precursor gases 310 sprayed from the showerhead 230 can be dispersed on the substrate 110. In some embodiments, the pedestal 220 can be made of metal or other suitable materials.

In FIG. 2, the CVD apparatus 200 can further include a heating element 250 connected to the pedestal 220. The pedestal 220 can be heated by the heating element 250, which may be made from a refractive metal such as but not limited to, for example, molybdenum, tungsten, or rhenium and the like, or a non-metal such as graphite, which may be divided into multiple heating zones. The metal for the heating element 250 may be selected based on the reaction to be performed and heating characteristics suitable for a particular reactor and The CVD chamber 210. A heat shield (not shown) may be disposed below the heating element 250 and the pedestal 220. The heating element 250 may be controlled via an external automatic or manual controller. In some embodiments, the pedestal 220 is heated by the heating element 250 to a desired temperature of about 200° C., such that the temperature of the pedestal 220 is higher than the temperature of the showerhead 230 and the temperature of the sidewall 212. In other words, the temperatures of the showerhead 230 and the sidewall 212 are both lower than the temperature of the pedestal 220.

Reference is made to FIGS. 1C, 1D, and 2. The structure of FIG. 1 is disposed on the pedestal 220 of the CVD apparatus 200. The precursor gases 310 are then provided from the showerhead 230. In some embodiments, the precursor gases 310 can be $SiH_4$, $N_2O$, or $O_2$, and some carrier gases 320 may be introduced into the CVD chamber 210. The temperature of the showerhead 230 is controlled (or increased) to be in a range of about 70° C. to about 100° C. to control a temperature of the precursor gases 310. Hence, the heated precursor gases 310 are deposited on the substrate 110 and cover the NFET T1, PFET T2, and the substrate 110 to form the CESL 170.

According to the embodiments, the precursor gases are provided from the showerhead to form the contact etch stop layer (CESL) to cover the transistors and the substrate of the semiconductor device. The temperatures of the showerhead and the sidewall of the CVD chamber are controlled (or increased) to control (or increase) a temperature of the precursor gases. Since the showerhead is heated to the range of about 70° C. to about 100° C., the precursor gases passing therethrough are heated accordingly. The heated precursor gases are deposited on the substrate, thereby covering the transistors and the substrate to form the CESL. Since the showerhead has high temperature, i.e., in a range of about 70° C. to about 100° C., the heated precursor gases has high temperature, too. The CESL made of the high-temperature precursor gases can improve the adhesion to the transistors the substrate of the semiconductor device. Therefore, the CESL is not easy be peeled from the substrate, and the device performance of the semiconductor device can be improved.

According to some embodiments, a method for manufacturing a semiconductor device includes introducing a gas into a chamber from a showerhead. The chamber has a sidewall surrounding a pedestal. The temperature of the showerhead is increased. The showerhead is thermally connected to the sidewall of the chamber, and a temperature of the sidewall of the chamber is increased by increasing the temperature of the showerhead.

According to some embodiments, the method further includes forming a transistor on a substrate, and placing the substrate with the transistor thereon on the pedestal.

According to some embodiments, introducing the gas into the chamber is performed such that a contact etch stop layer (CESL) is deposited over the transistor.

According to some embodiments, the method includes performing a plasma treatment to the transistor and the substrate.

According to some embodiments, the plasma treatment is performed using a nitrous oxide ($N_2O$) plasma.

According to some embodiments, the method includes heating the pedestal.

According to some embodiments, heating the pedestal is performed such that a temperature of the pedestal is higher than the temperature of the showerhead.

According to some embodiments, increasing the temperature of the showerhead includes providing a fluid to the showerhead.

According to some embodiments, the temperature of the showerhead is increased to from about 70° C. to about 100° C.

According to some embodiments, the temperature of the sidewall of the chamber is increased to from about 70° C. to about 100° C.

According to some embodiments, a method for manufacturing a semiconductor device includes forming a transistor on a substrate, and introducing a gas into a chamber from a showerhead to deposit a contact etch stop layer (CESL) to cover the transistor and the substrate. The chamber has a sidewall, the sidewall defines an accommodating space to accommodate the substrate, and the sidewall is thermally connected to the showerhead. The thermally connected showerhead and sidewall are heated.

According to some embodiments, heating the thermally connected showerhead and sidewall is performed such that a temperature of the showerhead is increased to from about 70° C. to about 100° C.

According to some embodiments, heating the thermally connected showerhead and sidewall is performed such that a temperature of the sidewall is increased to from about 70° C. to about 100° C.

According to some embodiments, the method includes performing a plasma treatment to the transistor and the substrate prior to introducing the gas into the chamber.

According to some embodiments, the plasma treatment is performed using a nitrous oxide ($N_2O$) plasma.

According to some embodiments, a deposition apparatus includes a chamber having a sidewall, a pedestal disposed in the chamber, a showerhead disposed in the chamber and above the pedestal, and a temperature controlling system connected to the showerhead and the sidewall and configured to heat the showerhead and sidewall.

According to some embodiments, the temperature controlling system includes a heat exchanger.

According to some embodiments, the temperature controlling system includes a fluid cycle, and a controller configured to control a fluid flow rate in the fluid cycle.

According to some embodiments, the deposition apparatus includes a plasma generator in the chamber.

According to some embodiments, the deposition apparatus includes a heating element connected to the pedestal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

introducing a gas into a chamber from a showerhead, wherein the chamber has a sidewall surrounding a pedestal; and increasing a temperature of the showerhead to, from about 70° C. to about 100° C., wherein the showerhead is thermally connected to the sidewall of the chamber, and a temperature of the sidewall of the chamber is increased by increasing the temperature of the showerhead.

2. The method of claim 1, further comprising:

forming a transistor on a substrate; and placing the substrate with the transistor thereon on the pedestal.

3. The method of claim 2, wherein introducing the gas into the chamber is performed such that a contact etch stop layer (CESL) is deposited over the transistor.

4. The method of claim 2, further comprising:

performing a plasma treatment to the transistor and the substrate.

5. The method of claim 4, wherein the plasma treatment is performed using a nitrous oxide ($N_2O$) plasma.

6. The method of claim 1, further comprising:

heating the pedestal.

7. The method of claim 6, wherein heating the pedestal is performed such that a temperature of the pedestal is higher than the temperature of the showerhead.

8. The method of claim 1, wherein increasing the temperature of the showerhead comprises:

providing a fluid to the showerhead.

9. The method of claim 8, further comprising:

regulating a flow rate of the fluid to control a temperature of the showerhead.

10. The method of claim 1, wherein the temperature of the sidewall of the chamber is increased to from about 70° C. to about 100° C.

11. A method for manufacturing a semiconductor device, comprising:

forming a transistor on a substrate;

introducing a gas into a chamber from a showerhead to deposit a contact etch stop layer (CESL) to cover the transistor and the substrate, wherein the chamber has a sidewall, the sidewall defines an accommodating space to accommodate the substrate, and the sidewall is thermally connected to the showerhead; and heating the thermally connected showerhead and sidewall.

12. The method of claim 11, wherein heating the thermally connected showerhead and sidewall is performed such that a temperature of the showerhead is increased to from about 70° C. to about 100° C.

13. The method of claim 11, wherein heating the thermally connected showerhead and sidewall is performed such that a temperature of the sidewall is increased to from about 70° C. to about 100° C.

14. The method of claim 11, further comprising:

performing a plasma treatment to the transistor and the substrate prior to introducing the gas into the chamber.

15. The method of claim 14, wherein the plasma treatment is performed using a nitrous oxide ($N_2O$) plasma.

16. A method for manufacturing a semiconductor device, comprising:

transferring a substrate having a transistor thereon into a chamber, wherein the chamber has a sidewall and a showerhead disposed above the substrate and thermally connected to the sidewall;

performing a plasma treatment to the transistor and the substrate;

heating the showerhead such that a temperature of the sidewall of the chamber is increased; and after heating the showerhead, depositing a film on the transistor and the substrate.

17. The method of claim 16, wherein depositing the film on the transistor and the substrate comprises:

introducing a gas into the chamber through the heated showerhead.

18. The method of claim 16, wherein the plasma treatment is performed prior to depositing the film on the transistor and the substrate.

19. The method of claim 16, wherein the showerhead is heated by a fluid cycle.

20. The method of claim 16, further comprising raising the substrate close to the showerhead while depositing the film on the transistor and the substrate.

* * * * *